United States Patent
Shinada et al.

[11] Patent Number: 6,042,685
[45] Date of Patent: Mar. 28, 2000

[54] MULTIPLE WIRE PRINTED CIRCUIT BOARD AND PROCESS FOR MAKING THE SAME

[75] Inventors: Eiichi Shinada, Ibaraki-ken; Shigeharu Arike, Tochigi-ken; Takayuki Suzuki; Yoshiyuki Tsuru, both of Shimodate, all of Japan

[73] Assignee: Hitachi Chemical Company, Ltd., Tokyo, Japan

[21] Appl. No.: 09/192,213

[22] Filed: Nov. 16, 1998

Related U.S. Application Data

[62] Division of application No. 08/653,468, May 24, 1996, Pat. No. 5,928,757.

[30] Foreign Application Priority Data

May 26, 1995 [JP] Japan .................................. 7-128102

[51] Int. Cl.[7] .................................................. H05K 3/00
[52] U.S. Cl. ........................ 156/292; 156/295; 156/303.1; 29/840
[58] Field of Search .................................. 156/292, 295, 156/303.1; 29/840

[56] References Cited

U.S. PATENT DOCUMENTS

| | | | |
|---|---|---|---|
| 3,646,572 | 2/1972 | Burr | 174/251 |
| 3,674,602 | 7/1972 | Keogh et al. | 156/433 |
| 3,674,914 | 7/1972 | Burr | 174/261 |
| 4,097,684 | 6/1978 | Burr | 174/262 |
| 4,554,405 | 11/1985 | Varker | 174/251 |
| 4,642,321 | 2/1987 | Schoenberg et al. | 523/400 |
| 4,855,333 | 8/1989 | Rudik et al. | 522/71 |
| 5,225,268 | 7/1993 | Shibata et al. | 428/220 |
| 5,304,399 | 4/1994 | Shibata et al. | 427/386 |

*Primary Examiner*—Francis J. Lorin
*Attorney, Agent, or Firm*—Antonelli, Terry, Stout & Kraus, LLP

[57] ABSTRACT

A multiple wire printed circuit board including printed conductor circuit layers, adhesive layers with wires having insulating coating embedded and fixed therein, insulating layers, and connecting through-holes formed at locations where connections will be made, wherein the conductor circuit layers are insulated from other circuit conductors, and the difference in glass transition point between each adhesive layer and the adjoining insulating layer is within the range of 60° C., remains free of peel and voids despite heat history applied to the board, and is capable of high-density wiring, multiplication of circuit layers and a reduction of the number of the manufacturing steps.

12 Claims, 4 Drawing Sheets

FIG. 1D" 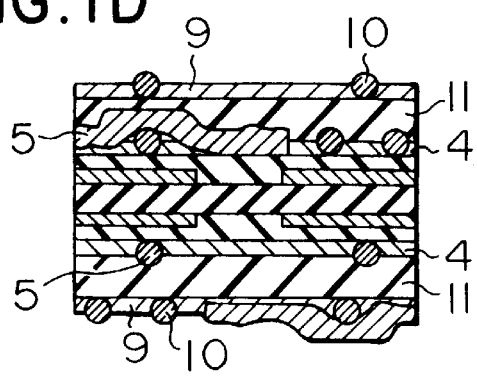
FIG. 1F" 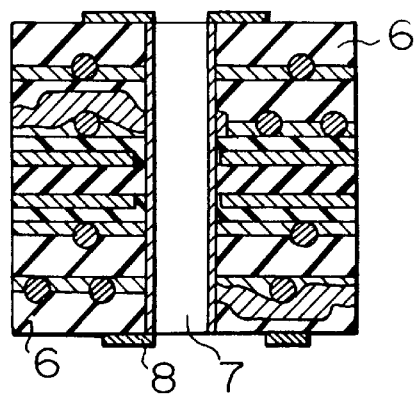

MULTIPLE WIRE PRINTED CIRCUIT BOARD AND PROCESS FOR MAKING THE SAME

CROSS REFERENCE TO RELATED APPLICATION

This application is a Divisional of application Ser. No. 08/653,468, filed on May 24, 1996, now U.S. Pat. No. 5,928,757.

BACKGROUND OF THE INVENTION

The present invention relates to a multiple wire printed circuit board using wires having insulating coating as circuit conductors, and a process for making such a circuit board.

Multiple wire circuit boards having an adhesive layer provided on a substrate, with the insulating layer coated wires for forming conductor circuits being bonded to said adhesive layer and with the respective layers interconnected by through-holes, are disclosed in U.S. Pat. Nos. 4,097,684, 3,646,572, 3,674,914 and 3,674,602, and known as printed wiring boards which are capable of high-density wiring and advantageous for matching of characteristic impedance and reduction of crosstalks.

The processes for making multiple wire circuit boards having an adhesive layer composed of a thermosetting resin, a curing agent and a rubber, disclosed in the above-mentioned U.S. patents, comprise essentially the steps of ① forming inner layer circuits, ② laminating an adhesive, ③ wiring, ④ laminating a prepreg, ⑤ drilling and ⑥ copper plating. Lamination of a layer of prepreg in step ④ is necessary for fixing the insulating layer coated wires in the substrate for preventing them from coming off during drilling or for preventing the insulating coating layers of wires from suffering damage to reduce reliability in the plating step for forming a metal layer in the holes.

Use of a rubber material for the adhesive layer is necessary for the following reason. Since an adhesive agent is applied on a support film and dried to form an adhesive sheet and it is laminated and bonded on an insulated substrate or inner layer circuit board having a layer of prepreg laminated thereon, it is required that the adhesive layer can be formed as a film, and that it has flexibility and can remain non-adhesive except during wiring for facilitating handling of the adhesive layer in the circuit board making process.

Further, in view of the fact that when fixing the insulating layer coated wires to the adhesive layer, said wires are brought into contact with the adhesive by the end of a stylus which is vibrated by ultrasonic waves, and the adhesive is activated and fused by the heat energy generated by the ultrasonic vibrations, the adhesive is required to be made of a fusible composition.

In the prior art, insulation resistance can be confined within the permissible tolerance if the wiring density is in the conventional range. Also, with reference to positional accuracy of wires, although there has been observed a positional deviation of wires (hereinafter referred to as "wire swimming") of up to about 0.2 mm from the design value after wiring and laminating of the prepreg layer, the conventional wire setting could withstand practical use because of low wiring density and large hole size.

However, if wiring density is increased as mentioned above, insulation resistance lowers sharply where an adhesive comprising a rubber material is used. Also, as the wiring density increased with consequent diminution of through-hole size and enlargement of wire swimming, there arose the problem of improper connection due to shift of the insulating layer coated wires at the locations where through-holes are to be formed.

The cause of this reduction of insulating resistance and enlargement of wire swimming was attributable to use of a rubber material as an adhesive component. That is, low insulation resistance of the rubber material itself and the fact that a layer of prepreg has been laminated and bonded with fluidity of the rubber material in the adhesive being retained after wiring, were to blame for the occurrence of wire swimming.

For overcoming this problem, an adhesive comprising a phenoxy resin, an epoxy resin, a curing agent, a reactive diluent and an electroless plating catalyst has been developed as an adhesive sheet, as disclosed in JP-B 2-12995. According to this development reduction of insulation resistance is prevented by use of a polymer with high insulation resistance in place of the rubber material in the conventional adhesive.

In the prior art, prepreg pressing has been carried out after fixing of insulating layer coated wires. However, when this prepreg pressing is conducted using said adhesive after wiring, there takes place wire swimming to an excess extent, so that a heating step is incorporated between the wiring step and the pressing step to induce a slight degree of curing of the adhesive layer and to thereby inhibit wire swimming. Further, this adhesive had the problem of low solder heat resistance because of large amount of residual solvent.

Recently, increase of structural layers and miniaturization of printed wiring boards including multiple wire circuit boards are impelled to adapt them to high-density packaging. For implementing such increase of structural layers and miniaturization of multiple wire circuit boards, efforts have been made for increasing wiring density and for increasing and reducing size of the wiring layers. However, the multiple wire circuit board using the adhesive disclosed in JP-B 2-12995 involved the problem that solder heat resistance tends to lower as the wiring density increases. It was found that the breakage of conductors and wires was associated with the insulating layer coated wires and overlying layer of prepreg, or with the adhesive, and later, by providing an adhesive layer (covering adhesive layer) on the encapsulated wires for improving solder heat resistance, the wiring boards have become capable of practical use. However, provision of this covering adhesive layer has added to the number of steps and necessitated a longer time for completion of the process.

It was further found that multiplication of the wiring layers leads to a greater reduction of solder heat resistance than when only two wiring layers are provided. For instance, in a multiple wire circuit board having four wiring layers, there tends to take place peel or formation of voids in the adhesive layers on the inside two of the four wiring layers due to heat history. This phenomenon tends to occur in proportion as the through-holes piercing the multiple wire circuit board or the non-piercing via-holes increase, and it occurs typically in the adhesive layer.

A similar-phenomenon is also observed in the multi-layer circuit boards, and it is known that such a phenomenon occurs in the layers containing no reinforcement such as glass fabric or nonwoven fabric in the multi-layer circuit boards.

SUMMARY OF THE INVENTION

The present invention provides a multiple wire printed circuit board which remains free of peeling of the layers and formation of voids despite the heat history applied to the board, and is capable high-density wiring, multiplication of wiring layers and a reduction of the number of steps for manufacture thereof, and processes for making such a circuit board.

In accordance with the present invention, there is provided a multiple wire printed circuit board comprising printed conductor circuit layers, adhesive layers in which wires having insulating coating are embedded and fixed, insulating layers, and connecting through-holes formed at the locations where connections will be made. Each conductor circuit layer is insulated from other conductor circuit layers through insulating layers, and the difference in glass transition point between each adhesive layer and the adjoining insulating layer is specified to fall within the range of 60° C.

There is also provided the process for making a multiple wire printed circuit board, which comprises providing an adhesive layer on at least one side of a printed conductor circuit layer insulated by an insulating layer or on at least one side of the insulating layer, applying wires having insulating coating on said adhesive layer embedding them and fixing them therein, providing thereon an insulating layer, and forming connecting through-holes at the locations where connections will be made, wherein the difference in glass transition point between the adhesive layer and the adjoining insulating layer is within the range of 60° C.

There is further provided the process for making a multiple wire printed circuit board, which comprises providing an adhesive layer on at least one side of a printed conductor circuit layer insulated by an insulating layer or on at least one side of the insulating layer, applying wires having insulating coating on said adhesive layer, embedding them and fixing them therein, providing an adhesive layer thereon, applying wires having insulating coating in said adhesive layer, embedding them and fixing them therein, providing thereon an insulating layer, and forming connecting through-holes at the locations where connections will be made, wherein the difference in glass transition point between the adhesive layer and the adjoining insulating layer is within the range of 60° C.

There is further provided the process for making a multiple wire printed circuit board, which comprises providing an adhesive layer on at least one side of a printed conductor circuit layer insulated by an insulating layer or on at least one side of the insulating layer, applying wires having insulating coating on said adhesive layer, embedding them and fixing them therein, providing thereon an insulating layer, further providing thereon an adhesive layer, applying wires having insulating coating on said adhesive layer, embedding them and fixing them therein, providing an insulating layer thereon, and forming connecting through-holes at the locations where connections will be made, wherein the difference in glass transition point between the adhesive layer and the adjoining insulating layer is within the range of 60° C.

DESCRIPTION OF THE PREFERRED EMBODIMENTS

Figure 1A:
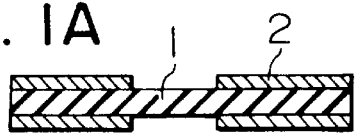
FIGS. 1A–1F, 1D', 1F', 1D" and 1F'" are schematic sectional views for illustrating the processes for making multiple wire printed circuit boards according to the present invention.

The multiple wire printed circuit board of the present invention comprises printed conductor circuit layers, adhesive layers in which wires having insulating coating are embedded and fixed, insulating layers, wherein each conductor circuit layer is insulated from other conductor circuit layers through insulating layers and connecting through-holes formed at the locations where connections will be made, and is characterized in that the difference in glass transition point between an adhesive layer (preferably each adhesive layer) and the adjoining insulating layer is defined to be not greater than 60° C.

In use of the materials that can implement the above condition, the glass transition points of the materials are examined and those materials which do not produce a greater difference than 60° C. in glass transition point are used for the layers adjoining each other. The smaller the difference in glass transition point between the adjoining layers, the better. Preferably such difference is not greater than 30° C. More preferably such difference is not greater than 20° C.

The term "glass transition point (Tg)" as used herein is defined as the glass transition point of the resin material after curing. The glass transition point is measured by using a thermo-mechanical analyzer (TMA), e.g. TMA 943 (tradename, manufactured by E.I. du Pont de Nemours and Co.). The glass transition point is that the temperature at which a material starts to transform the shape under the condition using compression mode of TMA, with a loading of 5 g and by raising the temperature from room temperature at a rate of 10° C./minute.

Curing conditions for measuring Tg are as follows.
(i) Insulating Layer

An epoxy resin or polyimide resin can be hot pressed at 150–180° C., under a pressure of 15–40 Kg/cm$^2$ for 30 to 120 minutes, followed by heat treatment at 160–190° C. for 60 to 180 minutes.
(ii) Adhesive Layer An epoxy resin or polyimide resin can be heated at 90–140° C. for 10 to 30 minutes to evaporate the solvent, followed by heating at 160–180° C. for 60 to 180 minutes.

It is preferable that the difference in glass transition point between the layer (adhesive layer or insulating layer) with the highest glass transition point and the layer with the lowest glass transition point falls within the range of 60° C., more preferably within the range of 30° C.

The adhesive layer of the present invention is generally formed on an insulating layer, and used for embedding and fixing wires having insulating coating therein. The adhesive layer is preferably one with excellent insulating performance without including a reinforcement such as a layer of an adhesive film. The adhesive films usable in this invention include polyimide type adhesive film and polymeric type epoxy adhesive film. Because of the good wiring property, etc. it is preferable that the weight-average molecular weight of the main resin component in the adhesive layer is 30,000 or more.

The insulating layer is preferably one containing reinforcement such as glass fabric or nonwoven fabric. For example, the resin-impregnated prepreg such as epoxy resin-impregnated prepreg, polyimide resin impregnated prepreg, and bismaleimide-triazine (BT) resin-impregnated prepreg, etc. are preferable. Because of the coating property, etc., it is preferable that the weight-average molecular weight of the main resin component in the insulating layer is 10,000 or less.

The weight-average molecular weight is measured by light scattering method.

Therefore, it is preferable to use different resin component for each of the adhesive layer and the insulating layer.

In case, for instance, a polymeric type epoxy adhesive film AS-3000 (trade name, available from Hitachi Chemical Co., Ltd.) is used for the adhesive layer, since the glass transition point (Tg) of this adhesive layer is in a range of 105–130° C., the layer usable as the adjoining insulating layer is the one with a glass transition point of 70–165° C., for example, GEA-67 (trade name, available from Hitachi Chemical Co., Ltd.) which is an epoxy resin-impregnated prepreg. The adhesive film AS-3000 having a Tg of 105°–130° C. can be obtained by hot pressing at 110–150° C. under 10–40 Kg/cm$^2$ for 15–60 minutes, followed by heat treatment, if necessary, at 150–200° C. for 30–120 minutes.

In case a polyimide-based adhesive film AS-2250 or AS-2210 (trade name, available from Hitachi Chemical Co., Ltd.) is used for the adhesive layer, since its glass transition point is 165–170° C., the adjoining insulating layer usable here is the one with a glass transition point of 110–225° C., for example, GEA-679 (trade name, available from Hitachi Chemical Co., Ltd.) which is an epoxy resin-impregnated prepreg, GIA-671 (trade name, available from Hitachi Chemical Co., Ltd.) which is a polyimide resin-impregnated prepreg, and GHPL-830 (trade name, available from Mitsubishi Gas Chemical Co., Ltd.) which is a BT resin-based prepreg.

The combinations of adhesive layer and insulating layer usable in the present invention are not limited to those mentioned above and other combinations can be used as well.

However, it is preferable to use a thermo-setting type resin such as polyimide type resin, epoxy type resin, BT resin, etc., as both layers described above, because of good heat resistance.

As explained above, it is desirable that the insulating material used for the adhesive layer and the insulating material used for the insulating layer are basically of the same type resin (but they have differences, such as molecular weight, formula, etc.) for avoiding peeling of the adhesive layer or formation of voids. The adhesive layer is preferably an insulator containing no reinforcement such as glass fabric or nonwoven fabric for applying insulating layer coated wires thereon, because the reinforcement disturbs embedding of wires. The insulator used for the insulating layer preferably contains said reinforcement, because it gives strength to a circuit board.

As the adhesive layer not containing reinforcement such as glass fabric or nonwoven fabric, there can be used a polymeric type epoxy film, a polyimide film or the like, and a B-stage film is preferred for facilitating wiring. The B-stage films which are commercially available and usable in the present invention include AS-3000 (trade name, available from Hitachi Chemical Co., Ltd.) which is a polymeric type epoxy adhesive film and AS-2250 and AS-2210 (trade names, both available from Hitachi Chemical Co., Ltd.).

As the polyimide resin used for the polyimide-based adhesive films, there can be employed a thermosetting resin composition comprising 40–70% by weight of a polyimide having a structural unit represented by the following formula (I), 15–45% by weight of the reaction product of bismaleimide and a diamine, and 15–45% by weight of an epoxy resin. As the epoxy resin, there can be used epoxy resins having two or more epoxy groups in average per molecule singly or as a mixture thereof. Examples of such epoxy resins are bisphenol epoxy resins, halogenated bisphenol epoxy resins, bisphenol novolac epoxy resins, halogenated bisphenol novolac epoxy resins, phenol novolac epoxy resins, halogenated phenol novolac epoxy resins, alkyl phenol novolac epoxy resins, polyphenol epoxy resins, polyglycol epoxy resins, alicyclic epoxy resins, etc. In case of using this adhesive film, it is recommended to make the B-stage softening point of this film fall in a range of 20–70° C for facilitating wiring.

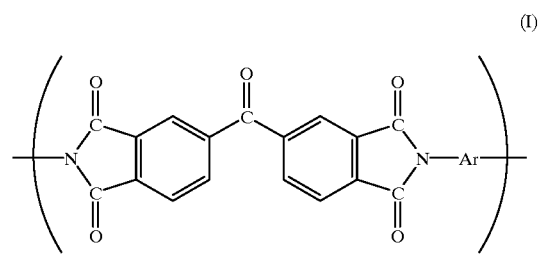

(I)

wherein Ar is a group represented by the following formula (II) or (III), preferably the ratio of the group of the formula (II) being 10–95% by mole and the ratio of the group of the formula (III) being 90–5% by mole:

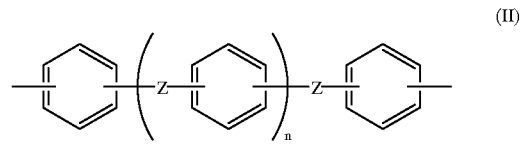

(II)

wherein Z's may be the same or different from each other and represent —C(=O)—, —SO$_2$—, —O—, —S—, —(CH$_2$)$_m$—, —NH—C(=O)—, —C(CH$_3$)$_2$—, —C(CF$_3$)$_2$—, —C(=O)—O— or a bond; n and m are each an integer of 1 or greater; and hydrogen in each benzene ring may be substituted with a pertinent substituent;

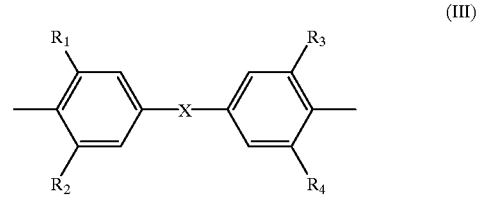

(III)

wherein R$_1$, R$_2$, R$_3$ and R$_4$ represent independently a hydrogen atom or an alkyl or alkoxyl group of 1–4 carbon atoms, with at least two of them representing an alkyl or alkoxyl group; X represents —CH$_2$—, —C(CH$_3$)$_2$—, —O—,—SO—$_2$—, —C(=O)— or —NH—C(=O)—.

The polyimide-based adhesive film AS-2250 and AS-2210 include said polyimide resin as the main component.

A process for making a multiple wire printed circuit board according to the present invention is described below with reference to FIGS. 1A–1F.

FIG. 1A illustrates an insulating plate 1 which has already been provided with printed conductor circuit layers 2 including power source and ground. This circuit may be formed by etching a metal-clad insulated plate such as a copper-clad epoxy-impregnated glass-cloth laminate or a copper-clad polyimide-impregnated glass-cloth laminate or other suitable methods known in the art. If necessary this inner layer circuit may be replaced by a multiple layer circuit. Such circuits may not be provided at all.

Figure 1B:
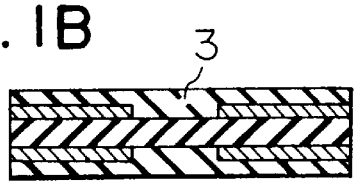

In the step of FIG. 1B, insulating layers 3 are formed on both sides of the substrate. These insulating layers are provided for improving electrolytic corrosion resistance or for adjusting characteristic impedance. They may be unnecessary in certain cases. These insulating layers 3 may be composed of an ordinary B-stage prepreg of epoxy- or polyimide-impregnated glass cloth or a B-stage insulator containing no reinforcement such as glass fabric or nonwoven fabric.

These insulating layers are laminated on the substrate and cured where necessary by a heat treatment.

Figure 1C:
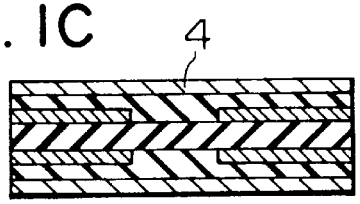

Then, as shown in FIG. 1C, adhesive layers 4 are provided in which the insulating layer coated wires 5 are to be laid and fixed. Methods are available for forming these adhesive layers, in which an adhesive varnish is directly applied on an insulating substrate by known means such as spray coating, roll coating or screen printing and then dried. These methods, however, are not recommendable because the layer thickness may become nonuniform, resulting in nonuniform characteristic impedance of the produced multiple wire circuit board. For obtaining an adhesive layer with uniform thickness, it is recommended to employ a method in which the adhesive is once roll coated on a carrier film of polypropylene, polyethylene terephthalate or the like and dried to form a dry film and then this film is hot roll laminated or press laminated on the insulated substrate. Also, this dry coating film is required to have sufficient flexibility to allow roll-up or cutting to a desired size and to have nontackiness so that no air cells will be entrapped when the film is laminated on the substrate. After the lamination, the carrier is removed.

Figure 1D:
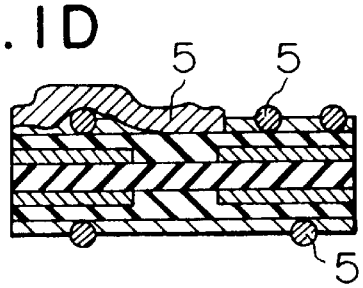

Next, wires having insulating coating 5 are laid as shown in FIG. 1D. Usually this wiring is conducted by a wiring machine applying ultrasonic vibrations under heating. In this treatment, the adhesive layers 4 are softened and wires 5 are embedded therein. It should be noted here that if the softening point of the adhesive layer is too low, there may arise troubles such as separation of the wire ends from the adhesive layer or warping of the wires at the corners where the wires are bent at right angles, making it unable to obtain desired positional precision.

Also, if the softening point of the adhesive layers 4 is too high, the following troubles may arise. The wires 5 may fail to be embedded sufficiently in the adhesive layer and may come off because of insufficient adhesive force between the wires 5 layer and the adhesive layer 4. Also, at the intersections of the wires 5, where the wire on the upper side passes over the wire on the lower side, the wire on the lower side may be pushed and displaced. It is, therefore, necessary to control the softening point of the adhesive layer 4 to remain in a proper range (e.g. 20 to 70° C.) during wiring.

The wires used in the circuit board of the present invention are the ones which are coated or encapsulated for insulation by, e.g. polyimide resin so as not to cause short-circuiting even when they were laid crossing each other on a same plane. The wire core is copper or a copper alloy and coated with polyimide or the like. A wire adhesive layer (or adhesive skin) may be additionally provided on the outside of the insulating coating for elevating the wire-to-wire adhesive force at the intersections. A thermoplastic, thermosetting or photo-curable type material can be used for forming said wire adhesive layer so as to adhere crossing wires as shown in FIG. 1D.

It is preferable to use a resin similar to the resin used as the adhesive layer 4 in order to prevent the generation of voids between the wire adhesive layer and the adhesive layer 4. More concretely, it is preferable to use as the wire adhesive layer phenoxy/polyvinyl butyrol/masking isocyanate resin, high molecular weight epoxy resin/low molecular weight epoxy resin, etc.

Wiring is followed by hot pressing. This treatment is carried out for reducing the unevenness of the wired substrate surface and removing voids left in the adhesive layers 4. Voids in the adhesive layers 4 are formed when the wires 5 are laid under ultrasonic heating or originate in the spaces formed near the intersections of the wires 5. It is essential to remove such voids in the adhesive layers 4 and to smoothen the wired substrate surface by hot pressing. After this hot pressing, an additional heat treatment may be carried out as desired to effect almost perfect curing of the adhesive layers 4.

Figure 1E:
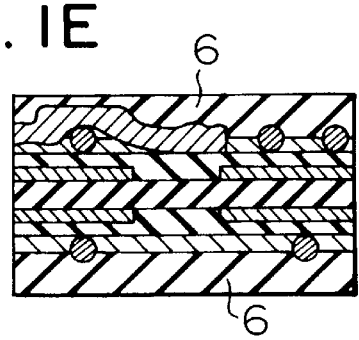

Then, as shown in FIG. 1E, an insulating layer 6 is provided on the wires 5 for protection thereof. This insulating layer 6 may be composed of an ordinary B-stage resin-impregnated prepreg or a B-stage insulator containing no glass fabric or nonwoven fabric, and is finally cured.

These insulating layers are laminated on the substrate and then, if necessary, cured by a heat treatment or pressing.

Figure 1F:
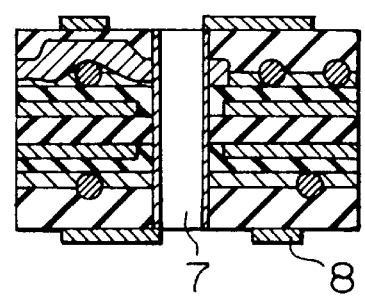
Figure 1D:
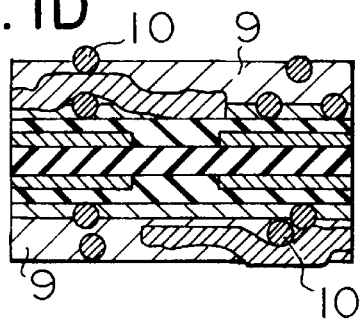
Figure 1F:
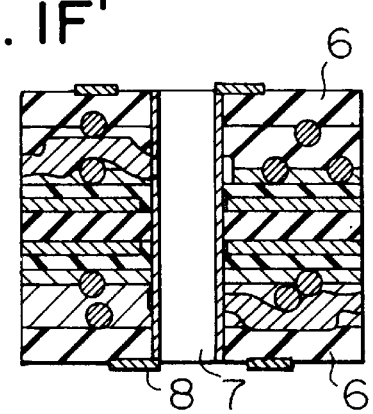
Figure 2:
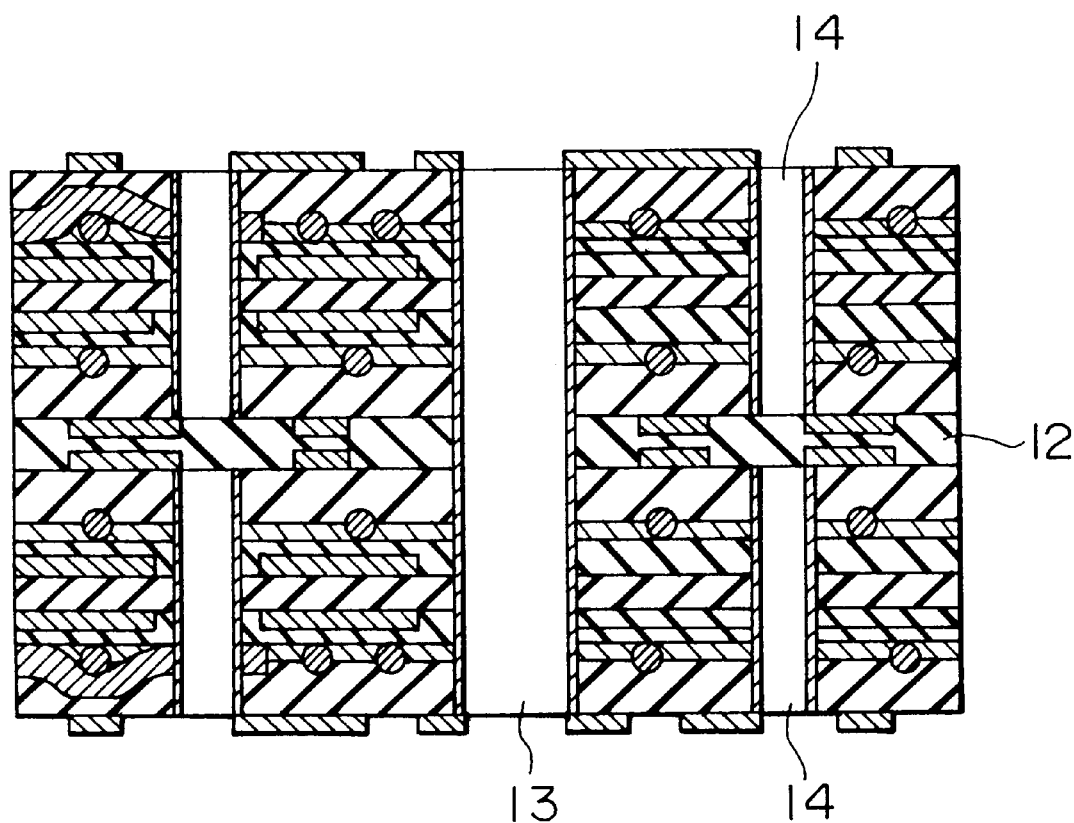
FIG. 2 is a schematic sectional view for illustrating a process for making a multiple wire printed circuit board according to the present invention.

Next, as shown in FIG. 1F, holes are drilled at the necessary locations and subjected to electroless copper plating or other treatments to form through-holes 7, thus completing a multiple wire printed circuit board.

For obtaining a multiple wire printed circuit board having surface circuits 8, a copper foil is attached to the board surface through a prepreg layer when forming the insulating layers 6, and the conductor circuits 8 are formed by a known etching or solder plating method to make a multiple wire printed circuit board having surface circuits.

In another process for forming multiple wire layers, as shown in FIG. 1D', the adhesive layer 4 having the wires 5 applied thereon is subjected to hot pressing or a heat treatment to cure the adhesive layer to thereby fix the wires 5 (FIG. 1D), and adhesive layers 9 are further formed thereon in the same way as the adhesive layers 4. In FIG. 1D', numeral 10 denotes wires having insulating coating. The wires 10 are formed in the same way as the wires 5.

Then, as shown in FIG. 1F', insulating layers 6, through-holes 7 and if necessary surface circuits 8 are formed in the same manner as described above to make a multiple wire printed circuit board.

Since a flat substrate facilitates wiring, it is expedient to provide the insulating layers 11 before forming the adhesive layers 9 to provide a flat surface as shown in FIG. 1D'. These insulating layers 11 can be formed in the same way as the insulating layers 6, and are finally cured. It is also possible to make a multiple wire printed circuit board in the manner illustrated in FIG. 1F'.

If the difference in glass transition point between an adhesive layer and the adjoining insulating layer exceeds 60° C., when the assembly is cooled after expanded by heating, the adhesive layer with a low glass transition point does not lose its fluidity and shows a persistent tendency to contract although the insulating layer with a high glass transition point is perfectly solidified with drop of temperature, and consequently a large stress is built up. This stress may cause break of the adhesive layer at the parts where the through-holes or via-holes are formed in close order.

Figure 3A:
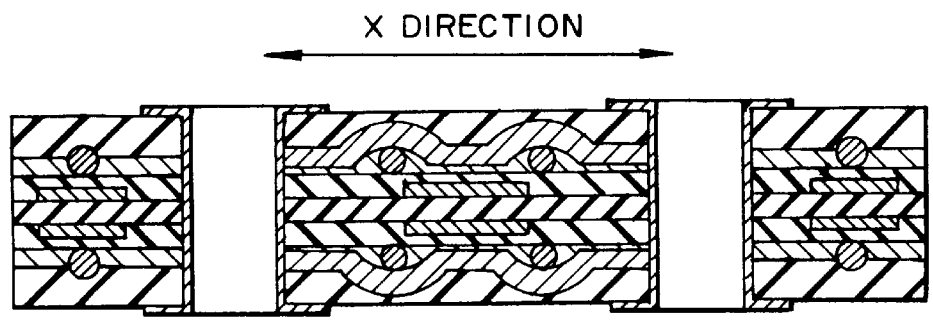
FIG. 3A–3C are schematic sectional views for illustrating the problems involved in the conventional processes.
Figure 3B:
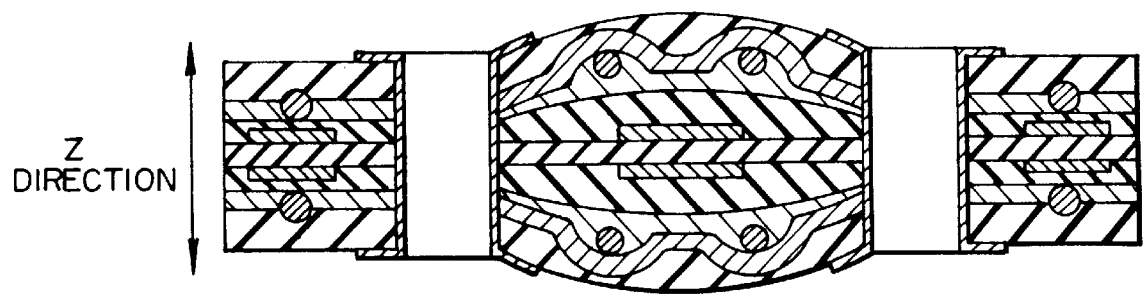
Figure 3C:
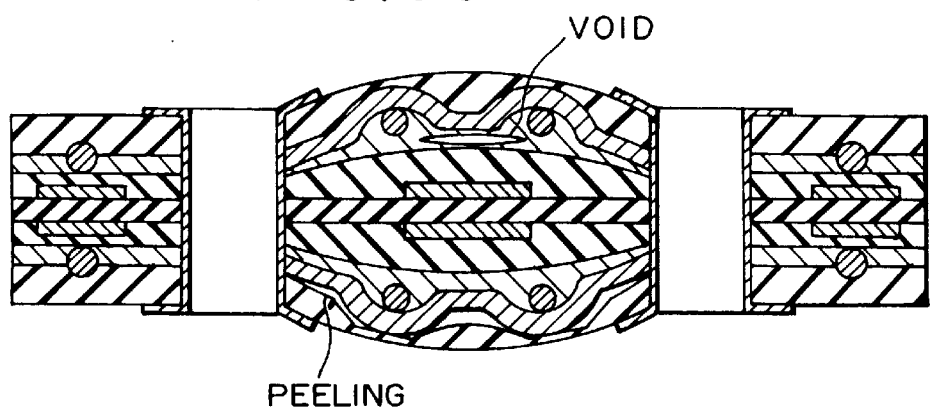
Figure 4:
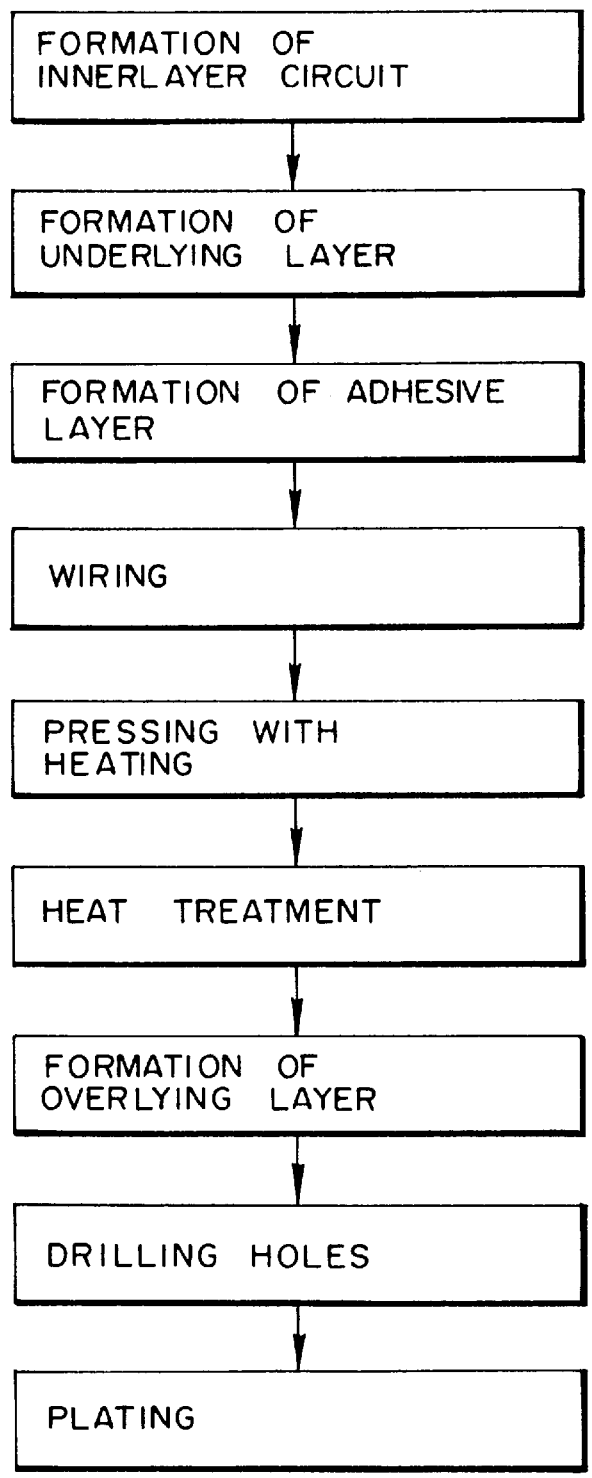
FIG. 4 is a flow chart illustrating an example of process for making a multiple wire printed circuit board according to the present invention.

More specifically, as illustrated in FIGS. 3A–3C, generally a multiple wire printed circuit board is subject to the following phenomena.

(1) The movement of the substrate in the X direction is restricted by the presence of through-holes or via-holes (FIG. 3A).

(2) When heated, the insulating layers and the adhesive layers are expanded in the non-restricted Z direction of the substrate to form a barrel-like swelling flanked by the through-holes or via-holes (FIG. 3B).

(3) On cooling, this barrel-like swelling is not perfectly eliminated but is merely allowed to recede to a shape at the point when the insulating layer with a high glass transition point is solidified.

(4) The adhesive layer with a low glass transition point keeps on behaving to restore the original shape even through the insulating layer with a high glass transition point has been solidified, but since the insulating layer with a high glass transition point is solidified, a large stress is built up between both layers.

(5) This stress tends to cause peeling of the layers and formation of voids therein.

The above knowledge underlies the present invention, that is, the present invention is based on the finding that if the difference in glass transition point between each adhesive layer and the adjoining insulating layer falls within the range of 60° C., there is produced no such large stress as to cause peeling of layers or formation of voids. The smaller the difference in glass transition point, the better. Preferably, such difference is within the range of 30° C.

It is desirable that not only the difference in glass transition point between an adhesive layer and the adjoining insulating layer but also the difference in glass transition point between the insulated plate and the adhesive or insulating layers used in the multiple wire circuit board is as small as possible, preferably not greater than 60° C., more preferably not greater than 30° C.

By defining the difference in glass transition point between an adhesive layer and the adjoining insulating layer in the above-specified range, it becomes possible to prevent peel of the layers and formation of voids due to heat history, to improve heat resistance of the wiring board, and to make a high-density multiple wire printed circuit board.

The following examples further illustrate the present invention.

EXAMPLE 1

Insulated Substrate

Circuits were formed on a copper-clad epoxy-impregnated glass cloth laminate MCL-E-67 (trade name, available from Hitachi Chemical Co., Ltd., the average molecular weight (Mw) of the epoxy resin is 1200 (by light scattering method)) having a glass transition point of about 120° C. by an ordinary etching method. Then an epoxy-impregnated prepreg GEA-679 (trade name, available from Hitachi Chemical Co., Ltd., the condition of B-stage, Mw of the epoxy resin is 1200 (by light scattering method)) having a glass transition point of about 120° C. (after curing) was applied on both sides of said substrate and cured by hot pressing to form an underlying layer (an insulating layer).

Formation of Adhesive Layers

Then a polymeric epoxy-based adhesive film AS-3000 (the condition of B-stage, Mw of the epoxy resin is 121,000 (by light scattering method)) having a glass transition point of about 120° C. (after curing) was laminated on both sides of the insulated substrate by hot pressing.

Wiring

Wires having insulating coating HVE-IMW (trade name, available from Hitachi Cable, Ltd., coated by a high molecular epoxy type resin) were laid on the adhesive layers by a wiring machine under supersonic heating.

Embedding of Wires

The adhesive layers having said wires laid thereon were hot pressed under the conditions of 130° C., 16 kgf/cm$^2$ and 30 minutes using silicone rubber as cushion.

Heat Treatment

The assembly was heat treated in a thermostat at 180° C. for 60 minutes to perfectly cure the adhesive layers to thereby fix the insulating layer coated wires.

Formation of Surface Circuit Layer

An epoxy-impregnated prepreg GEA-67 (trade name, available from Hitachi Chemical Co., Ltd., the condition of B-stage) having a glass transition point of about 120° C. (after curing) was applied on both sides of the assembly, and then an 18 $\mu$m copper foil was further applied thereon and cured by hot pressing at 175° C., 21 kg/cm$^2$ for 30 minutes to form a surface circuit layer.

Drilling/Formation of Through-Holes

The substrate was drilled at the necessary spots.

After drilling, the assembly was subjected to pretreatments such as hole cleaning and then immersed in an electroless copper plating solution to effect about 30 $\mu$m thick through-hole plating, followed by formation of the surface circuits by etching to make a multiple wire printed circuit board.

EXAMPLE 2

Insulated Substrate

Circuits were formed on a copper-clad polyimide-impregnated glass cloth laminate MCL-I-671 (trade name, available from Hitachi Chemical Co., Ltd., Mw of the polyimide resin is 1100 (by light scattering method)) having a glass transition point of about 220° C. by an ordinary etching method. Then a polyimide resin-impregnated prepreg GIA-671 (trade name, available from Hitachi Chemical Co., Ltd., the condition of B-stage, Mw of the polyimide resin is 1100 (by light scattering method)) having a glass transition point of about 220° C. (after curing) was applied on both sides of the substrate and cured by hot pressing to form an underlying layer (an insulating layer).

Formation of Adhesive Layers

A polyimide-based adhesive film AS-2250 (the condition of B-stage. Mw of the polyimide is 6500 (by light scattering method). This resin composition comprises 50% by weight of a polyimide having a structural unit represented by the formula (I), 25% by weight of the reaction product of bismaleimide and a diamine, and 25% by weight of a bisphenol A type epoxy resin. The softening point in the B-stage is 40° C.) having a glass transition point of about 170° C. (after curing) was laminated on both sides of an insulated substrate by hot pressing.

Wiring

Wires having insulating coating of polyimide and a wire adhesive layer thereon HVE-IMW (trade name, available from Hitachi Cable, Ltd.) were laid on the adhesive layers by a wiring machine under supersonic heating.

Embedding of Wires

The assembly was hot pressed using silicone rubber as cushion under the conditions of 160° C., 16 kgf/cm$^2$ and 30 minutes.

Heat Treatment

The thus treated assembly was heat treated in a thermostat at 180° C. for 60 minutes to perfectly cure the adhesive layers to thereby fix the insulating layer coated wires therein.

Formation of Surface Circuit Layer

A polyimide-impregnated prepreg GIA-671 (trade name, available from Hitachi Chemical Co., Ltd., the condition of B-stage) was applied on both sides of the assembly, and an 18 μm copper foil was further applied thereon and cured by hot pressing (at 130° C. under 5 kg/cm² for initial 10 minutes, then raising to 30 kg/cm², while raising the temperature to 170° C. after 40 minutes, and maintaining at 170° C. for 90 minutes, followed by cooling to 40° C. or less and removing pressing) to form a surface circuit layer.

Drilling/Formation of Through-Holes

The substrate was drilled at the necessary spots.

After drilling, the assembly was subjected to pretreatments such as hole cleaning and then immersed in an electroless copper plating solution to effect about 30 μm thick through-hole plating, followed by formation of the surface circuits by etching to make a multiple wire printed circuit board.

EXAMPLE 3

The multiple wire printed circuit boards produced in Example 2 were bonded by hot pressing to both sides of a polyimide-impregnated prepreg GIA-671 (trade name, available from Hitachi Chemical Co., Ltd., the condition of B-stage) having an glass transition point of about 220° C. (after curing), followed by drilling and through-hole plating to make a four-layered wire printed circuit board having via-hoes.

EXAMPLE 4

A multiple wire printed circuit board was produced by following the same procedure as Example 1 except that the final step of heat treatment was omitted. According to this condition, the glass transition point of the adhesive film layer after curing was about 110° C.

EXAMPLE 5

A multiple wire printed circuit board was produced by following the same procedure as Example 2 except that the step for the heat treatment was omitted. According to this condition, the glass transition point of the adhesive layer after curing was about 160° C.

EXAMPLE 6

The procedure of Example 2 was followed except that the copper-clad polyimide-impregnated laminate was replaced by a single-copper-clad BT resin-based laminate CCH-HL 830 (trade name, available from Mitsubishi Gas-Chemical Co., Ltd.) having a glass transition point of about 170°0 C. to make a multiple wire printed circuit board.

Any of the multiple wire printed circuit boards manufactured in Examples 1–6 was free of peel and voids in the initial state. Also, there took place no peeling of layers nor formation of voids after a 2-minutes floating test at 260° C.

COMPARATIVE EXAMPLE 1

The procedure of Example 2 was followed except that an epoxy/phenoxy resin-based adhesive film AS-102 (trade name, available from Hitachi Chemical Co., Ltd.) having a glass transition point of about 95° C. (after curing) was used as the adhesive layer in place of AS-2250, and that HAW-216C (trade name, available from Hitachi Cable, Ltd., coated by a phenoxy type resin) was used as the insulating and adhesive layers coating wires in place of HVE-1MW to produce a multiple wire printed circuit board. Because of the facilitating wiring, the wire of this Example was different from Example 2.

COMPARATIVE EXAMPLE 2

The procedure of Example 2 was followed except that wire embedding and the hot pressing and heat treatment were omitted to make a multiple wire printed circuit board.

COMPARATIVE EXAMPLE 3

The procedure of Example 2 was followed except that an epoxy solder resist ink CCR-506 (trade name, available from Asahi Kagaku Kenkyusho, Ltd.) having a glass transition point of 100–105° C. (after curing) was used for the overlying layer to make a multiple wire printed circuit board.

The multiple wire printed circuit boards produced in Comparative Examples 1–3 were free of peel and voids in the initial state, but there were observed peel of the layers and formation of voids after a 2-minutes solder float test (JIS C-6481) conducted at 260° C.

As described above, according to the present invention, there are provided a multiple wire printed circuit board which is highly proof against peel of the layers and formation of voids due to heat history applied to the board and is also capable of high-density wiring and multiplication of the circuit layers, and a process for making such a multiple wire printed circuit board.

What is claimed is:

1. A process for making a multiple wire printed circuit board, which comprises providing an adhesive layer on at least one side of a printed conductor circuit layer insulated by an insulating layer or on at least one side of the insulating layer, applying wires having insulating coating on said adhesive layer, embedding them and fixing them therein, providing thereon an insulating layer, and forming connecting through-holes at the locations where connections will be made, wherein the difference in glass transition point between the adhesive layer and the adjoining insulating layer is within the range of, and wherein said insulating layer is made from a polyimide resin.

2. A process for making a multiple wire printed circuit board, which comprises providing an adhesive layer on at least one side of a printed conductor circuit layer insulated by an insulating layer or on at least one side of the insulating layer, applying wires having insulating coating on said adhesive layer, embedding them and fixing them therein, providing an adhesive layer thereon, applying the insulating layer coated wires in said adhesive layer and fixing them therein, providing thereon an insulating layer, and forming connecting through-holes at the locations where connections will be made, wherein the difference in glass transition point between the adhesive layer and the adjoining insulating layer is within the range of 60° C., and wherein said insulating layer is made from a polyimide resin.

3. A process for making a multiple wire printed circuit board, which comprises providing an adhesive layer on at least one side of a printed conductor circuit layer insulated by an insulating layer or on at least one side of the insulating layer, applying wires having insulating coating on said adhesive layer, embedding them and fixing them therein, providing an insulating layer thereon, further providing thereon an adhesive layer, applying wires having insulating coating on said adhesive layer, embedding them and fixing them therein, providing an insulating layer thereon, and forming connecting through-holes at the locations where connections will be made, wherein the difference in glass transition point between the adhesive layer and the adjoining insulating layer is within the range of 60° C., and wherein said insulating layer is made from a polyimide resin.

4. The process according to claim 1, wherein when the surface insulating layer is provided, a conductor layer is also formed simultaneously on the surface of the insulating layer, and this conductor layer is properly worked to form conductor circuits at the necessary locations.

5. The process according to claim 2, wherein when the surface insulating layer is provided, a conductor layer is also formed simultaneously on the surface of the insulating layer, and this conductor layer is properly worked to form conductor circuits at the necessary locations.

6. The process according to claim 3, wherein when the surface insulating layer is provided, a conductor layer is also formed simultaneously on the surface of the insulating layer, and this conductor layer is properly worked to form conductor circuits at the necessary locations.

7. A process for making a multiple wire printed circuit board, which comprises preparing two or more units of multiple wire printed circuit board according to any of the following processes: a process comprising the steps of providing an adhesive layer on at least one side of a printed conductor circuit layer insulated by an insulating layer or on at least one side of the insulating layer, applying wires having insulating coating on said adhesive layer, embedding them and fixing them therein, providing an insulating layer thereon and forming connecting through-holes at the locations where connections will be made, wherein the difference in glass transition point between the adhesive layer and the adjoining insulating layer is within the range of 60° C.; a process comprising the steps of providing an adhesive layer on at least one side of a printed conductor circuit layer insulated by an insulating layer or on at least one side of the insulating layer, applying wires having insulating coating on said adhesive layer, embedding them and fixing them therein, further providing thereon an adhesive layer, applying wires having insulating coating on said adhesive layer, embedding them and fixing them therein, providing an insulating layer thereon, and forming connecting through-holes at the locations where connections will be made, wherein the difference in glass transition point between the adhesive layer and the adjoining insulating layer is within the range of 60° C.; a process comprising the steps of providing an adhesive layer on at least one side of a printed conductor circuit layer insulated by an insulating layer or on at least one side of the insulating layer, applying the wires having insulating coating on said adhesive layer, embedding them and fixing them therein, providing an insulating layer thereon, further providing thereon an adhesive layer, applying wires having insulating coating on this adhesive layer, embedding and fixing them therein, providing an insulating layer thereon, and forming connecting through-holes at the locations where connections will be made, wherein the difference in glass transition point between the adhesive layer and the adjoining insulating layer is within the range of 60° C.; or a process comprising the steps according to any of the above-mentioned processes and further characterized in that when providing the insulating layer, a conductor layer is also formed simultaneously on the surface of the insulating layer and this conductor layer is properly worked to form conductor circuits at the necessary locations, laminating and bonding the thus prepared units of multiple wire printed circuit board with an insulating layer interposed between every adjoining units of board, and forming connecting through-holes at the locations where connections will be made, and wherein said insulating layer is made from a polyimide resin.

8. The process according to claim 1, wherein the adhesive layer is an insulator containing no reinforcement such as glass fabric or nonwoven fabric.

9. The process according to claim 1, wherein the adhesive layer comprises 40–70% by weight of a polyimide having a structural unit represented by the following formula (I), 15–45% by weight of a reaction product of bismaleimide and a diamine, and 15–45% by weight of an epoxy resin:

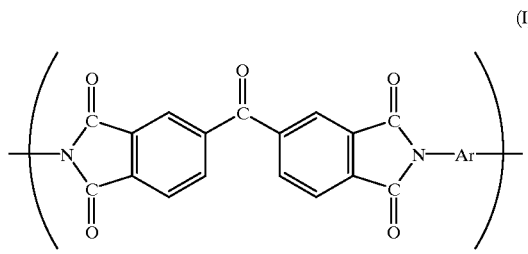

wherein Ar is a group represented by the following formula (II) or (III), with the ratio of the group of the formula (II) being 10–95% by mole and the ratio of the group of the formula (III) being 90–5% by mole;

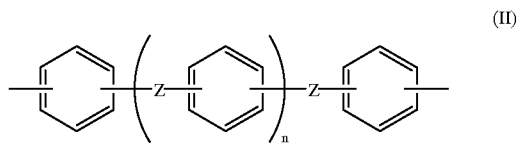

wherein Z's may be the same or different from each other and represent —C(=O)—, —SO$_2$—, —O—, —S—, —(CH$_2$)$_m$—, —NH—C(=O)—, —C(CH$_3$)$_2$—, —C(CF$_3$)$_2$—, —C(=O)—O— or a bond; n and m are each an integer of 1 or greater; and hydrogen in each benzene ring may be substituted with a pertinent substitute;

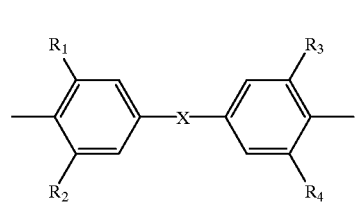

wherein R$_1$, R$_2$, R$_3$ and R$_4$ represent independently a hydrogen atom or an alkyl or alkoxyl group of 1–4 carbon atoms, with at least two of them representing an alkyl or alkoxyl group; and X represents —CH$_2$—, —C(CH$_3$)$_2$—, —O—, —SO$_2$—, —C(=O)— or —NH—C(=O)—.

10. The process according to claim 9, wherein the softening point of the adhesive layer in the B-stage falls in a range of 20–70° C.

11. The process according to claim 1, wherein the substrate having the wires having insulating coating laid on an adhesive layer is hot pressed to cure the adhesive layer, thereby embedding and fixing the wires having insulating coating in said adhesive layer.

12. The process according to claim 1, wherein the substrate having the wires laid on the adhesive layer is hot pressed and then further subjected to a heat treatment to perfectly cure the adhesive layer to thereby embedding and fixing the wires in said adhesive layer.

* * * * *